(12) United States Patent
Meagher

(10) Patent No.: US 8,352,051 B2
(45) Date of Patent: Jan. 8, 2013

(54) METHOD AND APPARATUS FOR DRIVING A LOAD

(75) Inventor: Thomas Bruce Meagher, Houston, TX (US)

(73) Assignee: Rockwell Automation Limited, Maldon, Essex (GB)

(*) Notice: Subject to any disclaimer, the term of this patent is extended or adjusted under 35 U.S.C. 154(b) by 408 days.

(21) Appl. No.: 12/403,581

(22) Filed: Mar. 13, 2009

(65) Prior Publication Data

US 2009/0234469 A1    Sep. 17, 2009

Related U.S. Application Data

(60) Provisional application No. 61/036,596, filed on Mar. 14, 2008.

(30) Foreign Application Priority Data

Sep. 26, 2008  (GB) ............................. EP08165303

(51) Int. Cl.
*G05B 9/02* (2006.01)
(52) U.S. Cl. ............... 700/79; 323/283; 307/125; 714/6
(58) Field of Classification Search ............. 700/79; 323/283; 307/125; 714/6
See application file for complete search history.

(56) References Cited

U.S. PATENT DOCUMENTS

| 4,786,822 A | 11/1988 | Steely |
| 6,550,018 B1 | 4/2003 | Abonamah et al. |
| 6,965,220 B2 * | 11/2005 | Kernahan et al. ............ 323/283 |

FOREIGN PATENT DOCUMENTS

EP    0554703    8/1993

OTHER PUBLICATIONS

European Search Report.

* cited by examiner

*Primary Examiner* — Tejal Gami
(74) *Attorney, Agent, or Firm* — Boyle Fredrickson, S.C.; William R. Walbrun; John M. Miller

(57) ABSTRACT

An output module for an Industrial Process Control System that drives a load in a failsafe manner. The output module drives a load in response to a driving signal and includes a controller that generates a command signal and a drive enable signal in response to said driving signal. A keep alive circuit generates an active keep alive signal unless the drive enable signal is inactive. The output module includes a driver circuit that generates a drive signal in accordance with the command signal when the keep alive signal is active such that the load can be driven with a channel failsafe switch in response to the drive signal. The output module can be integrated into any of a number of industrial process control systems to enhance the operability of such systems.

13 Claims, 8 Drawing Sheets

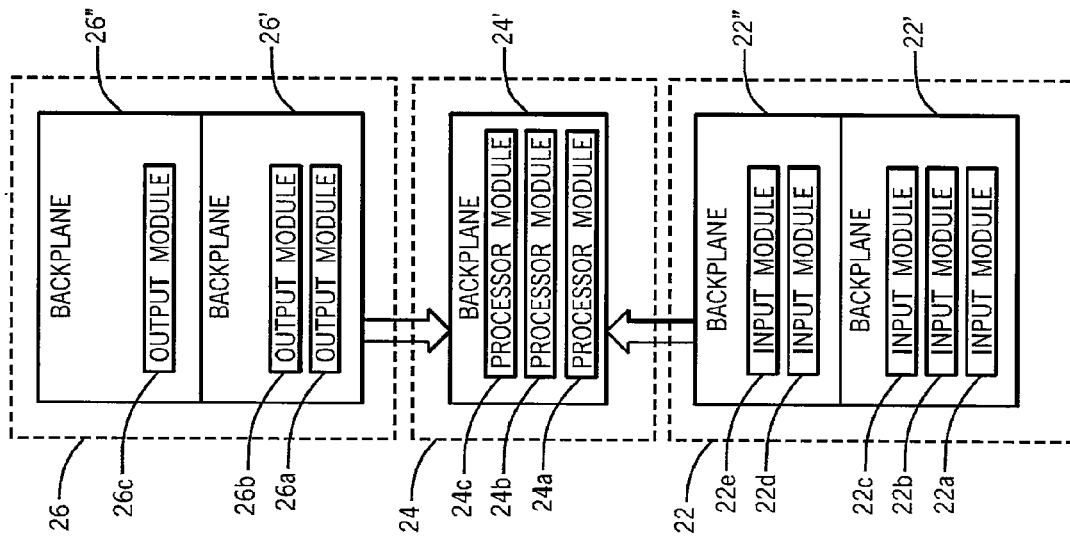
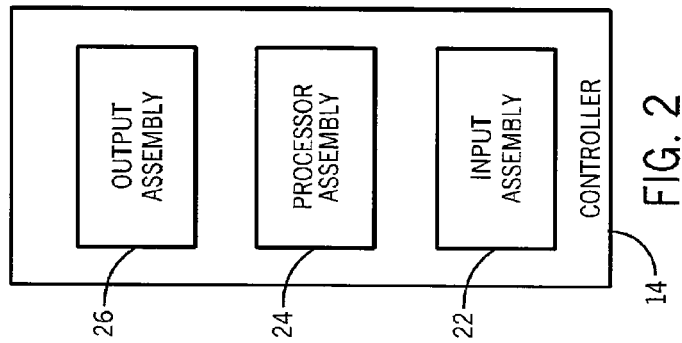

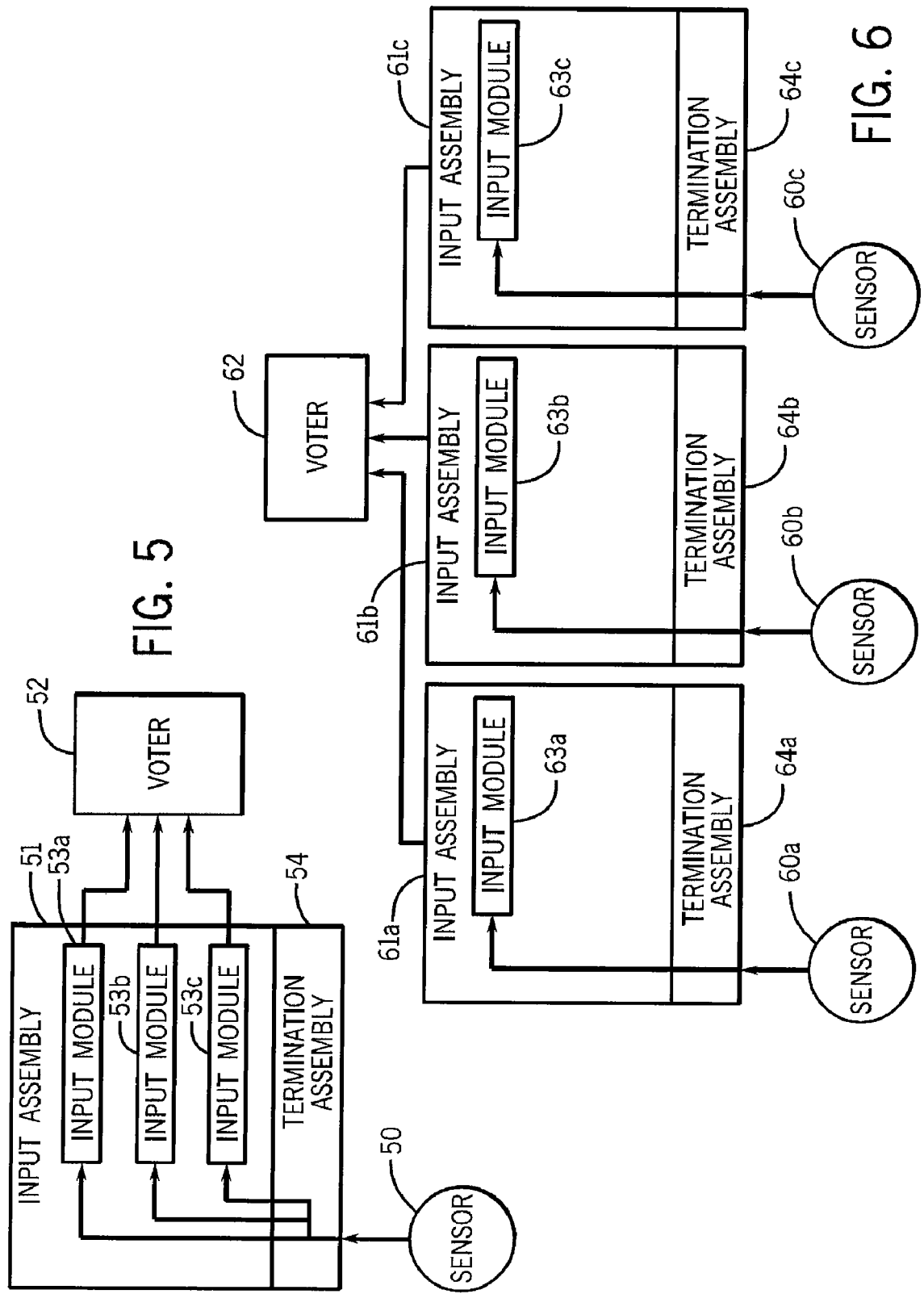

METHOD AND APPARATUS FOR DRIVING A LOAD

CROSS REFERENCE TO RELATED APPLICATIONS

This application claims priority to U.S. Provisional Patent Applicant Ser. No. 61/036,596 filed on Mar. 14, 2008, and European Patent Application No. EP08165303 filed on Sep. 26, 2008, the disclosures of which are incorporated herein.

BACKGROUND a. Field of the Invention

This invention relates to driving a load using an output module for an Industrial Process Control System in particular for an Industrial Process Control System suitable for operation of exemplary systems such as:
Emergency Shutdown systems;
Critical process control systems;
Fire and Gas detection and protection systems;
Rotating machinery control systems;
Burner management systems;
Boiler and furnace control systems; and
Distributed monitory and control systems.

Such control systems are generally applicable to many industries including oil and gas production and refining, chemical production and processing, power generation, paper and textile mills and sewage treatment plants.

b. Related Art

In industrial process control systems, fault tolerance is of utmost importance. Fault tolerance is the ability to continue functioning safely in the event of one or more failures within the system.

Fault tolerance may be achieved by a number of different techniques, each with its specific advantages and disadvantages.

An example of a system which provides redundancy is a Triple Modular Redundancy (TMR) system. Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

However, TMR systems are expensive to implement if full TMR is not actually a requirement, and it is desirable to utilise an architecture which provides flexibility so that differing levels of fault tolerance can be provided depending upon specified system requirements.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimens that provide very fast fault recognition and response times to provide reliable system operation.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example, if in a TMR system, a failed module is not replaced before a second failure in a parallel circuit occurs, the second failure should cause the TMR system to shut down to a fail-safe state. It is worth noting that a TMR system can still be considered safe, even if the second failure is not failsafe, as long as the first fault is detected and announced, and is itself failsafe.

Therefore, it is desired to provide a method of helping to ensure fail-safe operation that requires a signal to be continuously applied to an output circuit to maintain operation. In the event of a signal failure the output circuit is de-energised.

SUMMARY OF THE INVENTION

According to the invention there is provided an output module for driving a load comprising: a channel failsafe switch receiving a drive signal and driving the load in dependence upon said drive signal. A keep alive circuit generates a keep alive signal and a driver circuit receives said keep alive signal and generates said drive signal. A controller generates a command signal connected to said driver and a drive enable signal connected to said keep alive circuit. The driver circuit is arranged in operation to generate the drive signal in accordance with the command signal when said keep alive signal is active and the keep alive circuit is arranged in operation to generate an active keep alive signal only when said drive enable signal is active.

In a preferred embodiment the active drive enable signal comprises an alternating current signal and in which the shutdown circuit comprises a charge pump.

In one embodiment the driver circuit comprises an operational amplifier in which the shutdown signal is received by a shutdown pin in said operational amplifier.

The invention also provides an apparatus for industrial process control comprising a controller having a sensor for sending a sensor signal relating to process control apparatus; an input module for processing the sensor signal to generate an input signal; a processor connected to the input module for processing the input signal and sending an output signal to an output module in dependence thereon; and an output module as described above connected to receive the output signal and to drive the process control apparatus in dependence thereon.

According to another aspect of the invention there is provided a method of driving a load in response to a driving signal. The method comprises the steps of: a controller generating a command signal and a drive enable signal in response to said driving signal; a keep alive circuit generating an active keep alive signal when said drive enable signal is active; a driver circuit generating an output signal in accordance with said command signal unless said keep alive signal is inactive; and driving a load with a channel failsafe switch in response to said output signal.

In one embodiment the step of generating a drive signal comprises the step of generating an alternating current signal and in which the keep alive circuit suspends the active keep alive signal in the event no alternating current signal is received and generates an active keep alive signal in the event an alternating current signal is received.

The shutdown signal may be used to enable an operational amplifier in the driver circuit.

The invention also provides a method of driving an industrial process control apparatus comprising the steps of: receiving a sensor signal from an industrial process control apparatus and generating an input signal in dependence thereon; processing the input signal and generating an output signal in dependence thereon; and driving an industrial process control apparatus with the output signal according to the method described above.

BRIEF DESCRIPTION OF THE DRAWINGS

Embodiments of the invention will now be described, by way of example only, with reference to the accompanying drawings, in which:

FIG. 2 illustrates schematically a controller of the industrial process control system illustrated in FIG. 1;

FIG. 3 illustrates a possible configuration of a controller;

FIG. 5 shows one possible configuration implementing a two out of three voting strategy;

FIG. 6 illustrates a second possible configuration for a two out of three voting strategy;

DETAILED DESCRIPTION

Figure 1:
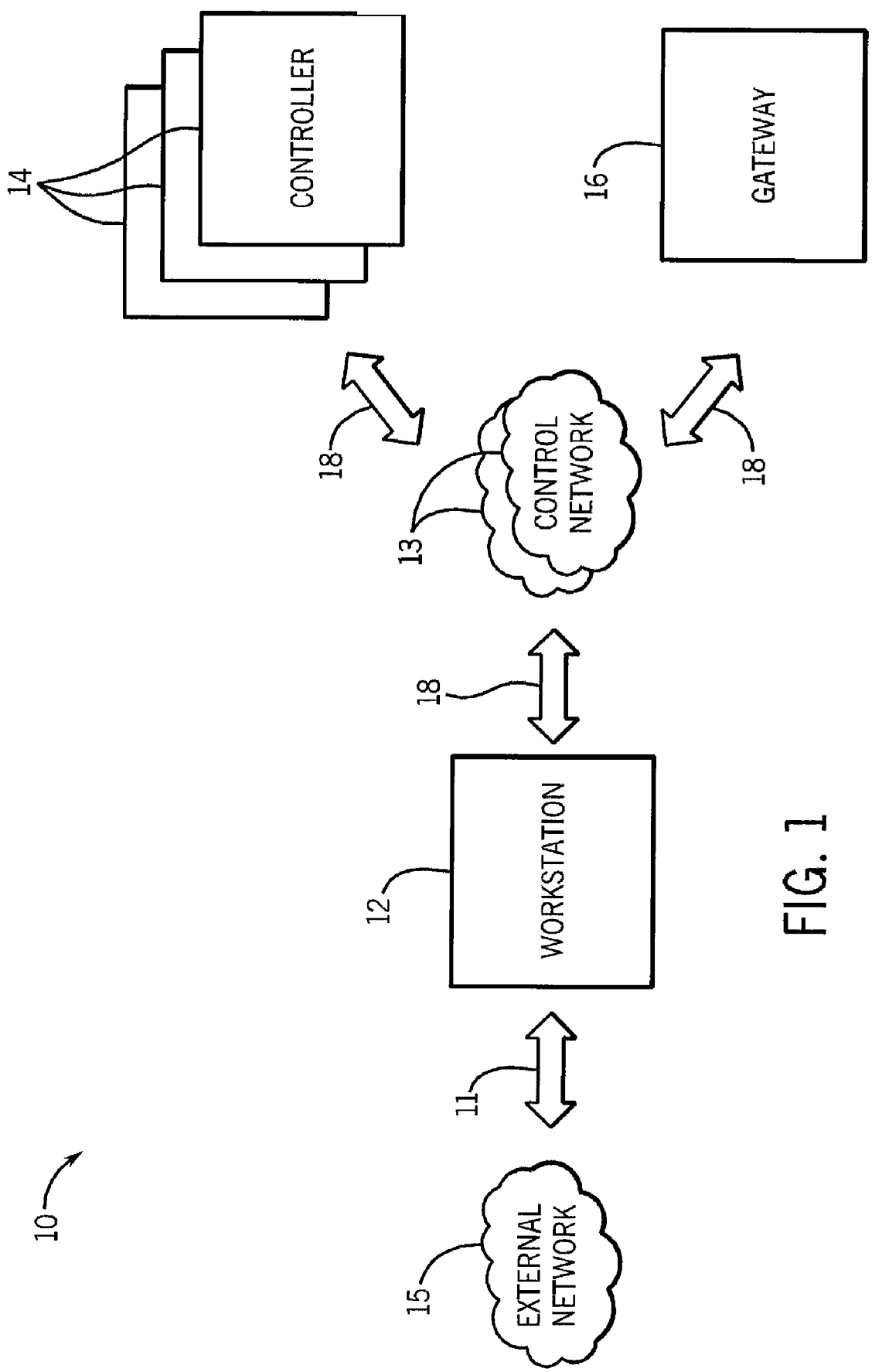
FIG. 1 is an illustration showing the architecture of a distributed industrial process control system which uses the apparatus and method of the present invention.

In the Industrial Process Control System shown in FIG. 1, a distributed architecture is designed to be used in different Safety Integrity Level (SIL) environments, so that if a high SIL is required it can be provided, but if a low SIL is all that is needed the system can be reduced in complexity in order to reduce unnecessary extra costs.

An exemplary Industrial Process Control System 10 comprises a workstation 12 one or more controllers 14 and a gateway 16. The workstation 12 communicates with the controllers 14 and the gateway 16 via Ethernet connections 18 to one or more control networks 13. Multiple Ethernet connections 18 provide redundancy to improve fault tolerance. The workstation 12 may be connected via a conventional Ethernet connection 11 to another external network 15.

A controller 14 will now be described in more detail with reference to FIGS. 2 and 3.

FIG. 2 illustrates a schematic diagram of the controller 14 comprising an input assembly 22, a processor assembly 24 and an output assembly 26. In this schematic illustration the input assembly 24 and output assembly 26 are on different backplanes but they may equally well share a single backplane.

Assemblies 22, 24, 26 are created from one or more communications backplane portions which have three slots to accommodate up to three modules together with termination assemblies which have one, two, or three slots, and which interface to field sensors and transducers. A termination assembly may straddle two contiguous backplane portions. A module comprises a plug in card with multiple connectors for plugging onto a communications backplane and a termination assembly.

It will be appreciated that having three slots in a communications backplane portion is one design option and other design options with greater (or fewer) slots are possible without departing from the scope of the invention as defined in the appended claims.

FIG. 3 illustrates a possible physical configuration of the controller 14. In this embodiment of the invention, the input assembly 22, output assembly 26 and processor assembly 24 are physically separated from one another by grouping the modules of different types onto separate communications backplanes.

In the example shown, the input assembly 22 comprises two communications backplane portions, 22', 22". The first backplane portion 22' has a triplex input termination assembly and three input modules 22a, 22b, 22c, the second backplane portion 22" has a duplex input termination assembly 22" and two input modules 22d, 22e. The processor assembly 24 comprises a single processor backplane portion 24' having three processor modules 24a, 24b and 24c. The output assembly 26 comprises two backplane portions 26', 26". The first backplane portion 26' has a duplex output termination assembly with two output modules 26a, 26b and the second backplane portion 26" has a simplex output termination assembly with a single output module 26c.

Figure 4:
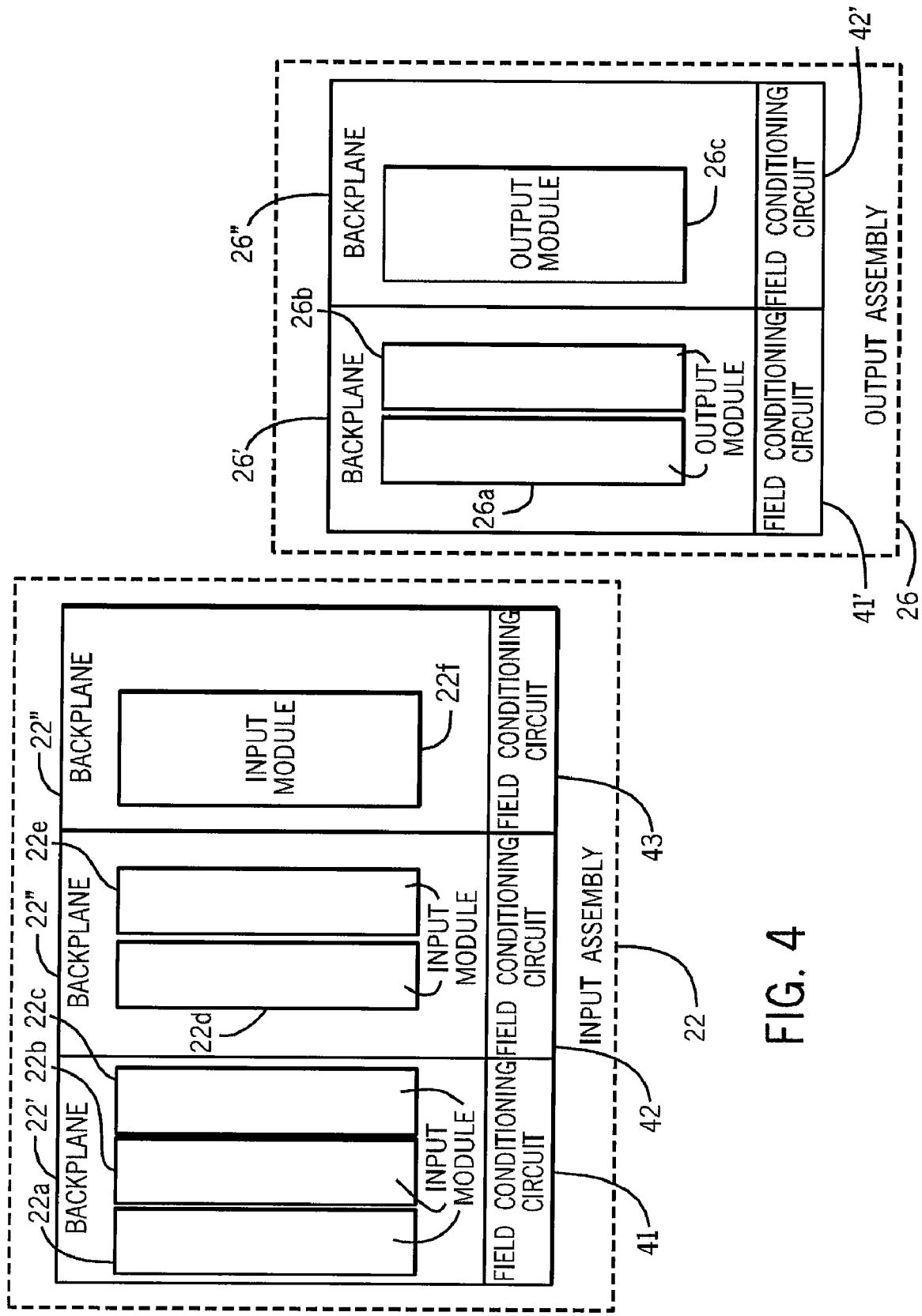
FIG. 4 shows various options for an input assembly and output assembly of the controller shown in FIG. 3.

The flexibility of the input assembly 22, will now be described, in more detail with reference to FIG. 4.

An input assembly 22 comprises one or more backplane portions and termination assemblies 22' 22" 22''' etc. For example, a triplex portion 22' having three modules 22a, 22b, 22c might be used for high availability requirement, a duplex portion 22" having two modules 22d, 22e might be provided for fault tolerant applications and a simplex portion 22''' with a single modules 22f might be provided for failsafe applications. The termination assemblies may be provided with different types of field conditioning circuits. For example assembly 22' may be provided with a 24V DC field conditioning circuit 41, assembly 22" may be provided with a 120V DC field conditioning circuit 42, and assembly 22''' may be provided with a 4-20 mA field conditioning circuit 43. Similarly possible configurations are shown for an output assembly 26. It will be appreciated that numerous configurations of backplane portions and termination assemblies with various different numbers of modules and various different types of field conditioning circuits are possible and the invention is not limited to those shown in these examples.

Where an assembly provides more than one module for redundancy purposes it is possible to replace a failed module with a replacement module whilst the industrial process control system is operational which is also referred to herein as online replacement (ie replacement is possible without having to perform a system shutdown). Online replacement is not possible for a simplex assembly without interruption to the process. In this case various "hold last state" strategies may be acceptable or a sensor signal may also be routed to a different module somewhere else in the system.

Preferably, the processor assembly configures a replacement processor module using data from a parallel module before the replacement module becomes active.

The field conditioning circuits 41, 42, 43 transform a signal received from a sensor monitoring industrial process control equipment to a desired voltage range, and distribute the signal to the input modules as required. Each field conditioning circuit 41, 42, 43 is also connected to field power and field return (or ground) which may be independently isolated on a channel by channel basis from all other grounds, depending on the configuration of the input termination assembly. Independent channel isolation is the preferred configuration because it is the most flexible. The field conditioning circuits 41, 42, 43 are comprised of simple non active parts and are not online replaceable.

FIG. 5 and FIG. 6 illustrate the flexibility of the architecture described herein showing different configurations for a triplex system for generating a signal with a high availability requirement. Referring to FIG. 5, a three module input assembly 51 receives a signal from a sensor 50 via a field conditioning circuit in termination assembly 54. The field conditioning circuit 54 transforms the signal to a desired voltage range and distributes the signal to three replicated input modules 53a, 53b, 53c. Each input module processes the signal and the results are sent to a two out of three voter 52 to generate a result signal in dependence thereon.

Referring to FIG. 6, replicated sensors 60a, 60b, 60c each send a signal to respective simplex assemblies 61a, 61b, 61c via respective field conditioning circuits in termination assemblies 64a, 64b, 64c. Each input module 63a, 63b, 63c processes the signal and sends an output to a two out of three voter 62 to generate a signal in dependence thereon. It will be appreciated that many variations and configurations are possible in addition to those illustrated here.

Figure 7:
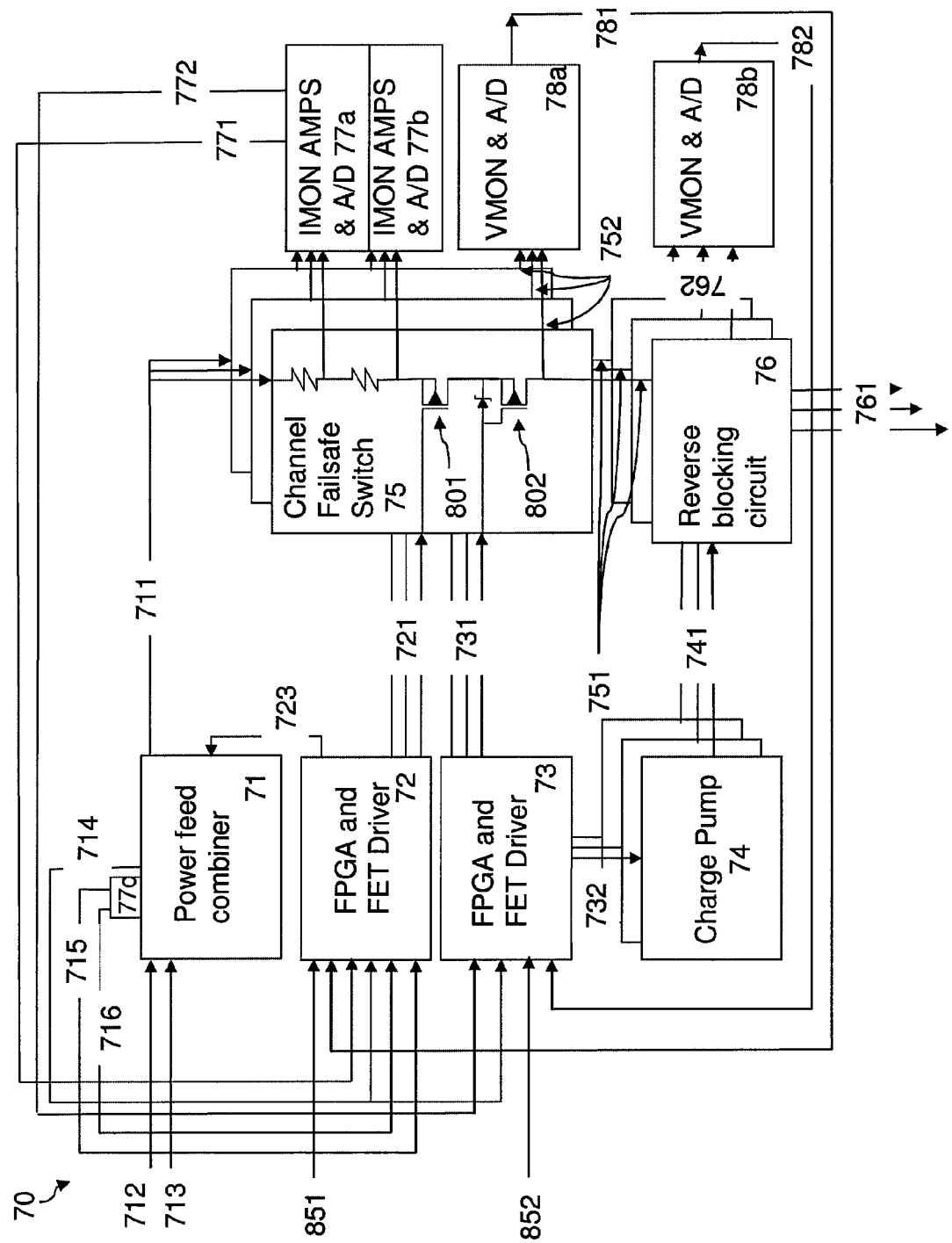
FIG. 7 illustrates an output module in accordance with the present invention.

FIG. 7 illustrates schematically an output module for driving industrial process control equipment in dependence upon a signal received and processed by a processor 24a, 24b, 24c in accordance with the present invention.

An output module 70 comprises a power feed combiner 71, a first field programmable gate array (FPGA) and field effect transistor (FET) driver 72, a second FPGA and FET driver 73. The drivers 72, 73 control a plurality of channels each channel driving a load (not shown) each channel comprising a channel failsafe switch 75 connected to a respective reverse blocking circuit 76 each of which is driven by a respective charge pump 74 (only three channels are shown schematically for clarity).

It will be appreciated that the incorporation of the control logic into an FPGA is not central to the invention; it is just a convenient implementation. The logic could equally well be implemented in an application specific integrated circuit (ASIC), or a general purpose microcomputer without departing from the scope of the invention as defined in the appended claims.

The current and voltages at various points in the channel are monitored by two arrays of current monitor amplifiers and A/D converters 77a, 77b and two arrays of voltage monitors and A/D converters 78a and 78b. In a preferred embodiment of the invention there are eight output channels served by eight channel failsafe switches 75 and associated reverse blocking circuits 76.

The first FPGA and FET driver 72 generates a plurality of signals 721 each of which drives a first FET 801 in each switch 75. The second FPGA and FET driver 73 generates a plurality of signals 731 each of which drives a second FET 802 in each switch 75.

Each voltage monitor signal 781, and each current monitor signal 771 is fed back into the first FPGA and FET driver 72, each voltage monitor signal 782 and each current monitor signal 772 is fed back to the second FPGA and FET driver 73 where various functions are carried out in dependence thereon.

Figure 8:
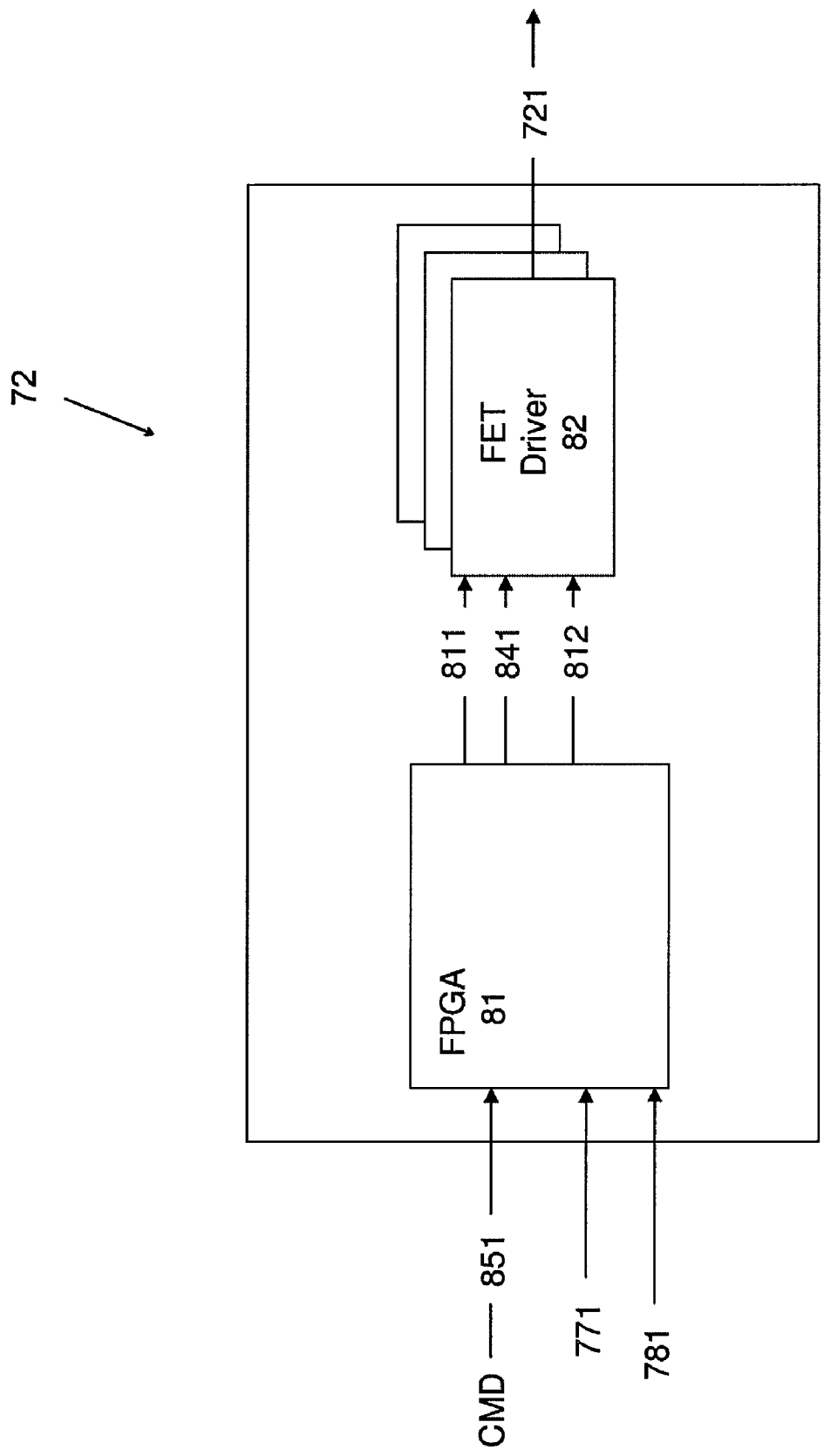
FIG. 8 is a block diagram illustrating an FPGA and FET driver of FIG. 7 in more detail.

FIG. 8 illustrates the FPGA and FET driver 72. The FPGA and FET driver 72 contains an FPGA 81 which controls a plurality of FET drivers 82. For clarity only three drivers 82 are shown in this schematic illustration, in the preferred embodiment there are eight drivers to drive each top FET (801, FIG. 7) in each channel failsafe switch 75 using respective signals 721. An enable signal 812 from the FPGA 81 is used to control the plurality of FET drivers 82. When the enable signal 812 is active the FET drivers 82 are enabled and when the enable signal 812 is not active the FET drivers 82 are disabled.

Figure 9:
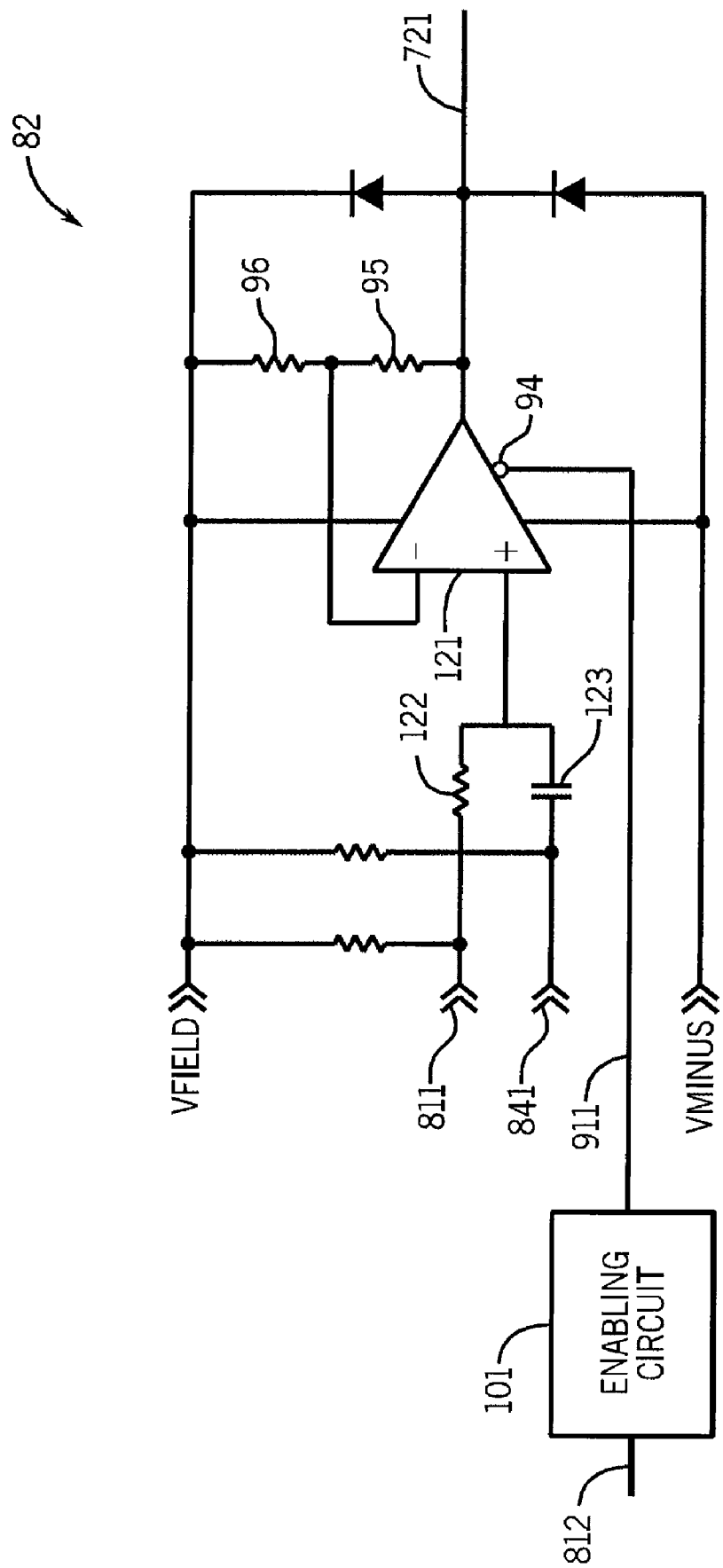
FIG. 9 is a circuit diagram illustrating part of the FET driver of FIG. 8 in more detail.
Figure 10:
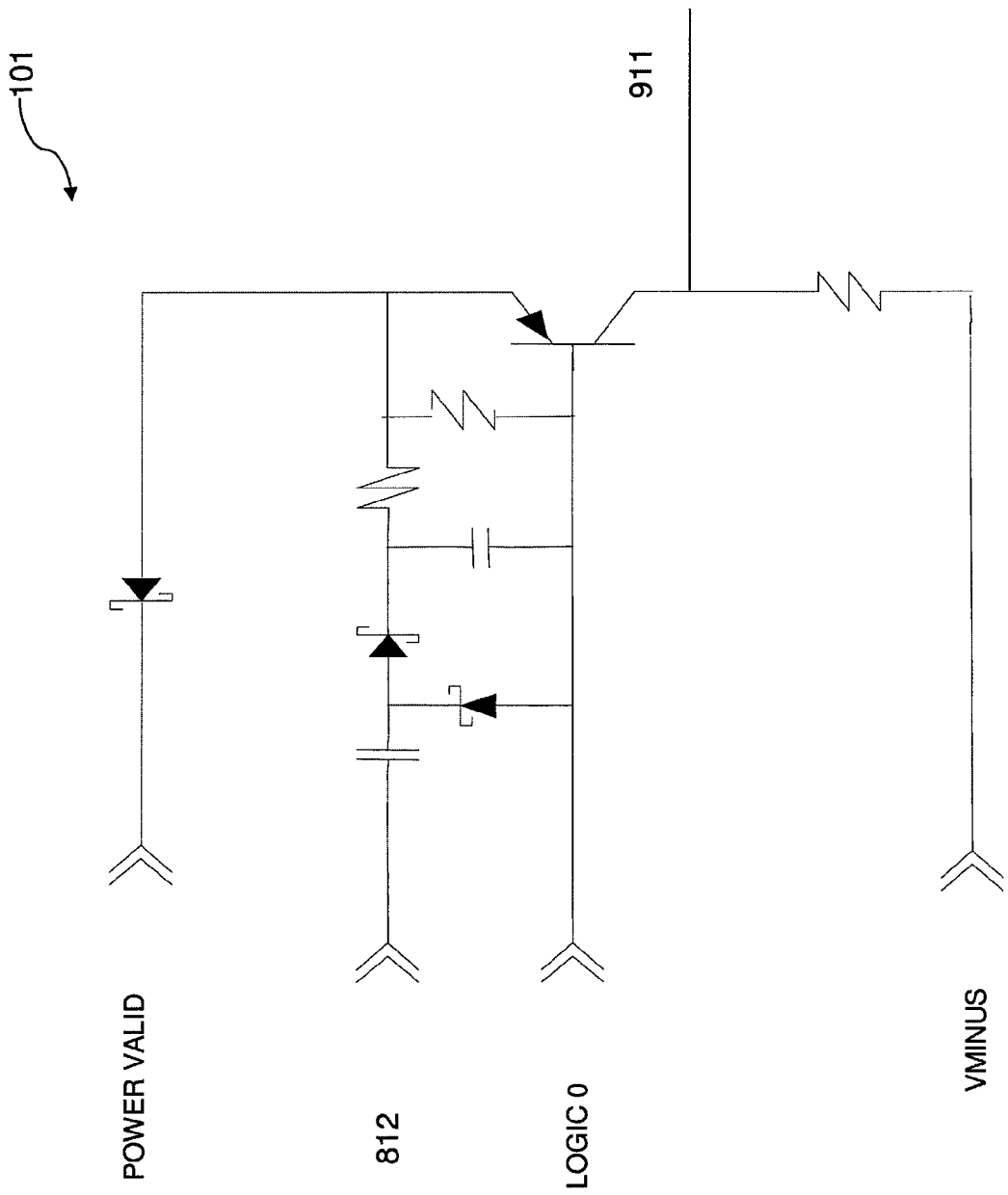
FIG. 10 is a circuit diagram illustrating a shutdown circuit within the FET driver of FIG. 8.

FIG. 9 illustrates the FET driver 82 in more detail. Enabling circuitry 101 receiving the enable signal 812 and generating shutdown signal 911 is illustrated in FIG. 10 and described more fully below. The FET driver 82 is driven using two signals, an AC coupled command signal 841 and a DC coupled command signal 811 from the FPGA 81.

The DC coupled command signal 811 is applied to an operational amplifier 121 through a resistor 122. The AC coupled command signal 841 is applied to the operational amplifier 121 through a capacitor 123. When driven to the same state simultaneously the two signals are used to rapidly turn the FET on or off. When the AC coupled command signal is held at one state, the DC coupled command signal may be Pulse Ratio Modulated (PRM) to the opposite state to create a variable output voltage on the FET drive signal 721. The high frequency PRM signal imposed on the DC coupled command signal 811 is smoothed by the RC filter created by resistor 122 and capacitor 123 into a precise DC voltage to the input of operational amplifier 121. By varying the PRM density, the FET drive signal 721 may be driven with a smooth controlled ramp to gradually drive the FET toward its opposite state in the linear mode of operation.

The DC coupled command signal 811 and the AC coupled command signal 841 are used for testing the operation of the FET's 801, 802 in the channel failsafe switch 75, and are not described further here.

In a preferred embodiment of the invention a dynamic drive enable 812 signal must be continuously applied to the FET driver 82 in order to maintain the outputs in the energized condition.

The FPGA 81 is responsible for generating the drive enable signal 812 to drive a charge pump in the FET driver 82 that feeds a de-energize to shutdown pin or a shutdown pin 94 on the operational amplifier 121.

FIG. 10 illustrates the enabling circuitry 101 which comprises a charge pump which must be driven to apply an enabling control voltage to the amplifier's shutdown pin 94. If the charge pump enable signal 812 is not driven by an AC signal of sufficient amplitude and frequency, then the amplifier's output 721 (FIG. 9) will go to a high impedance state, and the output will turn off by virtue of the pullup resistors 95, 96 collapsing the gate voltage supplied to the output FET 801, 802 (FIG. 7) for which it is responsible for driving.

An additional power valid signal is provided for a global failsafe shutdown path that is independent of the FPGA 81 driving the enable signal 812.

It will be appreciated that certain features of the invention, which are, for clarity, described in the context of separate embodiments, may also be provided in combination in a single embodiment. Conversely, various features of the invention which are, for brevity, described in the context of a single embodiment, may also be provided separately, or in any suitable combination.

It is to be recognized that various alterations, modifications, and/or additions may be introduced into the constructions and arrangements of parts described above without departing from the scope of the present invention as defined in the appended claims.

The invention claimed is:

1. An output module configured to selectively provide at least one output signal for driving a load comprising:
   a logic circuit configured to:
      receive an initial command signal to control the output signal,
      receive at least one monitor signal which is a function of the controlled output signal;
      generate at least one intermediate command signal responsive to the initial command signal, and
      generate a drive enable signal as a function of the initial command signal and the monitor signal;
   a keep alive circuit configured to generate a keep alive signal responsive to oscillation of the drive enable signal;
   a driver circuit configured to:
      receive said keep alive signal and each of the intermediate command signals,
      generate a drive signal responsive to the intermediate command signals if the keep alive signal is active, and
      disable the drive signal if the keep alive signal is not active; and
   a channel failsafe switch receiving the drive signal to selectively conduct power for the output signal in dependence upon the drive signal.

2. An output module according to claim 1, in which an active drive enable signal comprises an alternating current signal and in which the keep alive circuit comprises a charge pump.

3. An output module according to claim 1 in which the driver circuit comprises an operational amplifier and in which the keep alive signal is de-energized to shutdown a pin in said operational amplifier.

4. The output module according to claim 1 connected to a backplane portion of an output assembly having more than one output modules.

5. The output module according to claim 1 further comprising another driver circuit, each driver circuit associated with at least one of a number of channels.

6. The output module according to claim 5 wherein each of the number of channels includes a failsafe switch connected to a respective reverse blocking circuit.

7. The output module according to claim 6 wherein each respective reverse blocking circuit is associated with a respective charge pump.

8. A method of driving an industrial process control apparatus comprising:
   receiving an initial command signal at a logic circuit;
   receiving at least one monitor signal at the logic circuit;
   generating at least one intermediate command signal with the logic circuit responsive to the initial command signal;
   generating a drive enable signal with the logic circuit as a function of the initial command signal and the monitor signal;
   a keep alive circuit generating an active keep alive signal unless said drive enable signal is inactive;
   a driver circuit generating a drive signal in accordance with said intermediate command signal unless said keep alive signal is inactive; and
   driving a load with a channel failsafe switch in response to said drive signal.

9. The method according to claim 8, wherein generating the drive signal includes generating an alternating current signal, generating an active keep alive signal with the keep alive circuit when an alternating current signal is received, and generating an inactive keep alive signal with the keep alive circuit in the event no alternating current signal is received.

10. The method of claim 8 further comprising:
    generating the drive signal to depend on a sensor signal that is received from an industrial process control apparatus;
    processing the drive signal;
    generating an output signal as a function of the processed drive signal; and
    driving an industrial process control apparatus with the output signal.

11. The method of claim 10 further comprising communicating the output signal to more than one output module redundantly connected to a common load.

12. The output module of claim 1 wherein the monitor signal is one of a current level of the output signal and a voltage level of the output signal.

13. The output module of claim 1 wherein the intermediate command signals further comprise a DC coupled command signal and an AC coupled command signal.

* * * * *